Aug. 21, 1956 P. J. H. JANSSEN 2,760,071

CIRCUIT-ARRANGEMENT FOR SYNCHRONIZING AN OSCILLATOR AT A CONTROL-OSCILLATION

Filed Oct. 28, 1952

INVENTOR
PETER JOHANNES HUBERTUS JANSSEN

BY [signature]

AGENT

United States Patent Office 2,760,071

Patented Aug. 21, 1956

2,760,071

CIRCUIT-ARRANGEMENT FOR SYNCHRONIZING AN OSCILLATOR AT A CONTROL-OSCILLATION

Peter Johannes Hubertus Janssen, Eindhoven, Netherlands, assignor to Hartford National Bank and Trust Company, Hartford, Conn., as trustee Application October 28, 1952, Serial No. 317,310

Claims priority, application Netherlands November 6, 1951

1 Claim. (Cl. 250—36)

This invention relates to a circuit for synchronizing an oscillator at a control oscillation, an oscillation obtained from the oscillator and an oscillation obtained from the control oscillation being fed to a phase comparison stage the output voltage of which controls the oscillator frequency, said circuit including means for controlling the natural frequency of the oscillator.

Such known circuits for automatic frequency and phase control have various favorable properties.

Thus, for example, the oscillator frequency is comparatively insensitive to the occurrence of noise or other interference signals in the control oscillation.

In addition, the oscillator remains in synchronism with the control oscillation as long as the tendency for the oscillator natural frequency to change by reason of changes in temperature or supply voltage or by reason of changes in the adjustment of the means for controlling the natural frequency is not excessive.

If the natural frequency of the oscillator tends to vary, a variation of the relative phase of the oscillator oscillation and the control oscillation occurs since a variation of the natural frequency of the oscillator brings about a variation of the output voltage of the phase comparison stage and this potential variation compensates the variation of the natural frequency of the oscillator.

Operation of the means for controlling the natural frequency thus has the effect of producing a phase shift between the control oscillation and the oscillator oscillation.

Such a variation in phase may be harmful, for example in the case of television receivers, in which synchronization of the horizontal deflection for the beam of the cathode ray tube is due to the use of an automatic frequency and phase control circuit.

Due to the above-mentioned phase shift, turning the frequency control knob of the oscillator in such a receiver results in a shift of the image on the screen of the cathode ray tube in a horizontal direction.

The object of the invention is to reduce the phase shift between the control voltage and the oscillator voltage when controlling the natural frequency of the oscillator.

A circuit according to the invention is characterized in that the oscillation obtained from the oscillator is fed to the phase comparison stage via a network which produces a phase shift of the oscillation obtained from the oscillator, said network including means for controlling the phase shift produced which are coupled to the means for controlling the natural frequency of the oscillator so that the phase shift between the control oscillation and the oscillator oscillation is counteracted.

Figure 1:
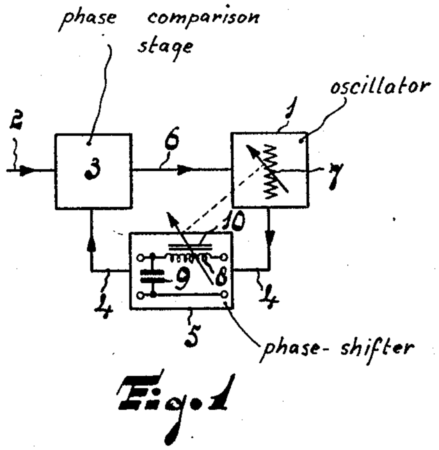
Figure 2:
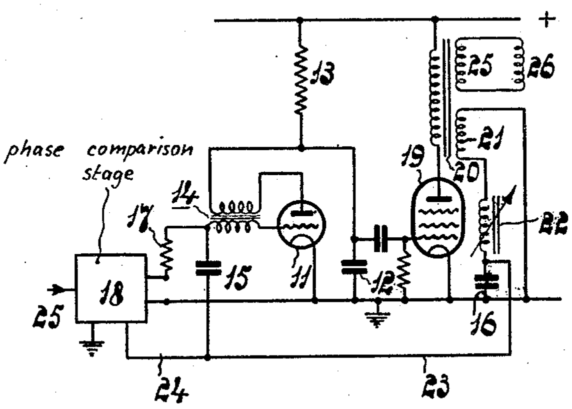

In order that the invention may be clearly understood and readily carried into effect it will now be described in detail with reference to the accompanying drawing, in which:

Fig. 1 is a schematic diagram, in block diagram form, of an embodiment of the circuit of the present invention; and Fig. 2 is a schematic diagram, in detail, of another embodiment of the circuit of the present invention.

In the circuit shown in Fig. 1 an oscillator 1 is synchronized by means of a control oscillation fed via a conductor 2 to a phase comparison stage 3.

A conductor 4, which includes a phase shifting network 5, passes an oscillation obtained from the oscillator 1 to the phase comparison stage 3.

The output voltage of the phase comparison stage 3 acts as a control voltage for the oscillator 1 and is fed to the oscillator 1 via a conductor 6.

The oscillator 1 comprises means for controlling its natural frequency, which is shown as a variable resistor 7.

If the oscillator 1 is formed as a blocking oscillator or as a multivibrator, such a variable resistor may be used as the grid leak of a tube of the oscillator 1.

As an alternative the oscillator natural frequency controlling means may be arranged in known manner so as to provide a variable conductance or a variable capacity or else as a controllable voltage. In the latter case it may be useful that, as earlier suggested, this bias voltage should not be supplied from the oscillator circuit but from the phase comparison stage 3 instead.

The phase comparison stage 3 may be of known type and for an understanding of the present invention it is important to state that in the output circuit of the stage 3 is produced a direct voltage the value of which is determined by the phase difference between the alternating voltages supplied to the stage 3 via the conductors 2 and 4, whereas an alternating voltage of beat frequency occurs in the output circuit if the two alternating voltages supplied are different in frequency.

As long as there is synchronism between the control oscillation and the oscillation produced by the oscillator 1 variation of the natural frequency of the oscillator due to variation of the natural frequency control member 7 will, in the absence of the phase shifting network 5, result in variation of the phase between the control oscillation and the oscillation produced by the oscillator 1.

However, the circuit 4 includes the phase shifting network 5 which is formed as a low-pass filter constituted by a series coil 8 and a parallel capacity 9.

The inductance of the coil 8 is variable due to the fact that in Fig. 1, the coil 8 is provided with a ferromagnetic core 10 adapted to move in the coil 8.

If the oscillator 1 produces, for example, a saw-tooth oscillation or a pulsatory oscillation there is only produced across the output of the phase shifting network 5 a sinusoidal voltage the frequency of which is equal to the fundamental frequency of the oscillator oscillation.

In accordance with the proportioning of the phase shifting network there is some phase shift between the input and output oscillation of fundamental frequency.

Any variation of the value of the inductance of the coil 8 results in a variation of this phase shift.

If the phase shifting network 5 is proportioned so that at a given variation of the inductance said phase shift is of just the same value as and occurs in a sense opposite to the variation in phase which would occur between the control oscillation and the oscillator oscillation upon operation of the natural frequency control member 7 and in the absence of the network 5, the latter phase shift is compensated by the former.

The effect of a variation of the natural frequency control member 7 may therefore be substantially compensated by a variation in inductance of the coil 8.

If the two control members are coupled together, the coupling member being conformed with the characteristic curves according to which the phase shift of the control members varies as a function of the control of the members, operation of the natural frequency control member 7 results in substantially no phase shift between the control oscillation and the oscillator oscillation.

If the natural frequency of the oscillator 1 can be varied to a small extent only with the aid of the natural frequency control member 7 the coupling mechanism may generally be of simple nature, since at small variations of the oscillator natural frequency the coupling mechanism varies in a substantially linear manner as a function of the variation of the natural frequency control member 7 as brought about and the phase shift in the phase shifting network 5 also varies in a substantially linear manner with the variation of the inductance of the coil 8, which in turn depends in a substantially linear manner on the displacement of the core 10.

It is to be noted that the frequency of the control oscillation is so far assumed to remain constant so that as long as the synchronism remains unaffected the oscillation produced by the oscillator 1 also retains the same frequency despite the fact that the natural frequency of the oscillator is varied.

Thus, the phase shifting network 5 fulfils its phase shifting function at a voltage the frequency of which remains constant due to the fact that an element of the said network is varied.

However, variation of the frequency of the control oscillation in the absence of the phase shifting network 5 also results in a phase shift between the control oscillation and the oscillator oscillation.

So long as synchronism remains unaffected the frequency of the oscillator oscillation varies in accordance with the frequency of the control oscillation but this occurs due to the fact, that in this case the phase comparison stage 3 produces a different control voltage which results in the said phase shift.

In the presence of the original frequency of the control oscillation the phase shifting network 5 produces a certain phase shift.

On the occurrence of the new frequency of the control oscillation the phase shifting network 5, which in these circumstances has consequently also supplied to it an oscillation having the new frequency, produces a phase shift.

The resulting phase difference reduces the phase shift which in the absence of the phase shifting network 5 would be produced between the control oscillation and the oscillator oscillation when the frequency of the control oscillation varies.

If consequently only the frequency of the control oscillation varies, the phase shifting network 5 fulfils its phase-shifting function without an element of the network being varied, due to the fact that the frequency of the oscillation supplied to the network is varied.

If the phase shifting network 5 is correctly proportioned and neither the variation of the natural frequency of the oscillator nor the variation of the frequency of the control oscillation is excessive, the phase shift produced in the absence of the phase shifting network 5 for each of the said variations will be sufficiently reduced for practical purposes when the network is included in the circuit.

For the sake of completeness it is to be noted that although in the use of the circuit according to the invention control by means of the natural frequency control member 7 of the oscillator 1 does not result in any appreciable phase shift, such control does not become useless in this case since the most important function of this control, that is, correct adjustment of the circuit in view of the width of the "holding range" of the phase control, is maintained.

Fig. 2 is a schematic diagram, in detail, of another embodiment of the circuit of the present invention. The electron discharge tube 11 forms part of a known blocking oscillator for producing a saw-tooth voltage across a capacitor 12 which is connected at one end to ground potential and at the other end to the anode resistor 13 of the tube 11.

The anode circuit of the tube 11 includes the primary of a transformer 14 the secondary of which is included in the control grid circuit of said tube.

The end of this secondary remote from the control grid of the tube 11 is connected to ground potential on the one hand via a series combination of capacitors 15 and 16 and on the other via a series combination of a resistor 17 and the grid voltage source constituted by the output circuit of the phase comparison stage 18.

The operation of the part of the circuit described, being known, a brief explanation is sufficient.

If the tube 11 is initially blocked, the series combination of the capacitors 15 and 16 being charged negatively, this charge will leak away via the resistor 17 and the output circuit of the phase comparison stage 18 until the increasing control grid voltage exceeds the cut-off point of the anode current-grid voltage characteristic curve of said tube.

The period required therefor is determined not only by the values of the capacities of the capacitors 15 and 16 and the resistance of the resistor 17 but also by the value of the control voltage produced by the phase comparison stage 18.

As long as the tube 11 is cut off the capacitor 12 is charged via the resistor 13 from the anode supply source.

When the tube 11 becomes conducting the capacitor 12 becomes discharged and in addition, since the primary of the transformer 14 passes anode current if the polarity of the coupling to the secondary of the transformer is properly chosen, the potential of the control grid is further increased so that a cumulative effect ensues and the anode current increases very rapidly with the result that the capacitor 12 is discharged quickly.

Meanwhile the potential of the control grid has increased to such an extent that an appreciable control grid current flows with the result that the capacitors 15 and 16 are again negatively charged.

The increase in anode current is limited by the saturation current of the tube 11 being reached so that the voltage induced across the secondary of the transformer 14 decreases and finally varies its polarity with the result that the tube is cut off.

Subsequently, the negative charge of the capacitors 15 and 16 leaks off again and a fresh cycle is started.

The frequency of the sawtooth voltage produced is consequently determined not only by the control voltage output of the phase comparison stage 18 but also by the exponential drain of the charge of the capacitors 15 and 16.

This exponential variation results in that the moment at which the cut-off point of the characteristic curve of the tube 11 is reached is not sharply defined and the moment of ignition of the tube 11 is highly sensitive to any interfering voltages occurring.

A known measure for remedying this fault is superposing an alternating voltage upon the control grid voltage of the tube 11.

The alternating voltage is obtained from a circuit tuned to the desired fundamental frequency of the oscillator in a phase such that at the end of the period of time during which the tube is cut off the grid voltage increases more rapidly than it would increase in the absence of said circuit.

This known measure is applied to the circuit-arrangement shown in Fig. 2.

The sawtooth voltage across the capacitor 12 is fed in usual manner to the control grid of an electron discharge tube 19.

The anode circuit of the tube 19 includes a transformer 20 and the voltage across the winding 21 of this transformer is fed to a series resonant circuit in which a coil 22 of variable inductance and the capacitor 16 are included.

The part of the alternating voltage of fundamental frequency which occurs across the capacitor 16 is supplied via a conductor 23 to the control grid circuit of the tube 11.

If the inductance of the coil 22 is varied the fundamental frequency of the oscillator varies.

The voltage across the capacitor 16 is also fed, by way of the conductors 23 and 24, to the phase comparison stage 18. The control oscillation is fed to the phase comparison stage 18 and 25.

The series resonant circuit 16, 22 is consequently also included as a phase shifting network in the supply circuit of the phase comparison stage 18 and the control mechanisms for varying the natural frequency of the oscillator and the phase shift are now combined.

If the natural frequency of the oscillator is varied by means of the coil 22 hardly any phase shift will occur between the control oscillation and the deflecting current of the deflecting coils 26 of a cathode ray tube, said current being obtained for example via the secondary 25 of the transformer 20.

If, for example, the natural frequency of the oscillator is controlled by variations of a control grid bias voltage it is possible for this variable bias voltage also to be used in the phase shifting network.

For this purpose the phase-shifting network may comprise a reactance tube, the value of the reactance being controlled by means of the controllable source of bias voltage.

As an alternative, the phase shifting network may include a coil in which for the purpose of obtaining a controllable inductance use is made of a controllable pre-magnetization of the coil core, the pre-magnetization current being obtained from the controllable source of bias voltage.

It is to be understood that the invention is not limited to the details disclosed but includes all such variations and modifications as fall within the spirit of the invention and the scope of the appended claim.

What I claim is:

A circuit arrangement for synchronizing a local oscillator in accordance with a control oscillation comprising a phase comparison stage, means for applying said control oscillation as an input to said stage, a phase shifting network, means for applying a local oscillation produced by said oscillator through said network as an input to said stage thereby to produce in said stage a control voltage dependent upon the difference in phase between said control oscillation and the oscillation applied from said network, means for applying said control voltage as an input to said oscillator thereby to synchronize said oscillator, and means for adjusting the natural frequency of said oscillator and for adjusting the phase shift of said network comprising a variable reactive element common to said oscillator and said network whereby a variation in phase shift as a function of a variation in frequency is effected in a direction counteracting the phase shift between said local oscillation and said control oscillation.

References Cited in the file of this patent

UNITED STATES PATENTS

| | | |
|---|---|---|
| 2,065,565 | Crosby | Jan. 7, 1936 |
| 2,408,684 | Roberts | Oct. 1, 1946 |
| 2,433,350 | Earp | Dec. 30, 1947 |
| 2,494,795 | Bradley | Jan. 17, 1950 |
| 2,545,346 | Edelsohn | Mar. 13, 1951 |